United States Patent [19]
Van Dort et al.

[11] Patent Number: 5,828,099
[45] Date of Patent: Oct. 27, 1998

[54] SEMICONDUCTOR DEVICE HAVING A NONVOLATILE MEMORY CELL IN WHICH THE FLOATING GATE IS CHARGED WITH HOT CHARGE CARRIERS AT THE SOURCE SIDE

[75] Inventors: Maarten J. Van Dort, Eindhoven, Netherlands; Andrew J. Walker, Palo Alto, Calif.

[73] Assignee: U.S. Philips Corporation, New York, N.Y.

[21] Appl. No.: 935,335

[22] Filed: Sep. 22, 1997

Related U.S. Application Data

[63] Continuation of Ser. No. 548,931, Oct. 26, 1995, abandoned.

[30] Foreign Application Priority Data

Oct. 28, 1994 [EP] European Pat. Off. .............. 94203146

[51] Int. Cl.$^6$ .................................................. H01L 29/76
[52] U.S. Cl. ............................................ 257/314; 257/315
[58] Field of Search ..................................... 257/314–326

[56] References Cited

U.S. PATENT DOCUMENTS

| | | | |
|---|---|---|---|
| 4,577,295 | 3/1986 | Eitan et al. ............................... | 365/218 |
| 4,769,340 | 9/1988 | Chang et al. ............................. | 437/52 |
| 5,019,879 | 5/1991 | Chiu ........................................ | 257/324 |
| 5,036,375 | 7/1991 | Mitchell ................................... | 257/316 |
| 5,200,636 | 4/1993 | Uemura et al. .......................... | 257/315 |
| 5,270,980 | 12/1993 | Pathak et al. ............................ | 257/314 |
| 5,274,588 | 12/1993 | Manzur et al. .......................... | 257/321 |
| 5,284,784 | 2/1994 | Manley .................................... | 257/321 |
| 5,294,819 | 3/1994 | Simko ...................................... | 257/322 |
| 5,326,999 | 7/1994 | Kime et al. .............................. | 257/321 |
| 5,394,360 | 2/1995 | Fukumoto ................................ | 257/318 |
| 5,404,037 | 4/1995 | Manley .................................... | 257/318 |
| 5,432,740 | 7/1995 | D'Arrigo et al. ........................ | 257/321 |
| 5,506,436 | 4/1996 | Hayashi et al. .......................... | 257/319 |
| 5,552,621 | 9/1996 | Kowalski ................................. | 257/322 |

OTHER PUBLICATIONS

Muller et al., Device Electronics for Integrated Circuit, "MOS Memory", pp. 459–454, 1986.

Ning et al., IBM Technical Disclosure Bulletin, "Self–Aligned Stack–Gate IGFET Device having an Underlying PN Junction for Charge Injection", vol. 21 No. 1, p. 402, Jun. 1978.

"A source–side injection erasable programmable read–only memory (SI–EPROM) device" by Wu et al., published in IEEE Electron Device Letters, vol. EDL–7, No. 9, Sep. 1986, pp. 540–542.

*Primary Examiner*—Mahshid D. Saadat
*Assistant Examiner*—S. V. Clark
*Attorney, Agent, or Firm*—Brian J. Wieghaus

[57] ABSTRACT

An (E)EPROM is provided in which information is written with hot electrons generated in the channel current at the source side of the channel instead of at the drain side, as is usual. To obtain the electric field distribution in the channel 6 necessary for this, the gate oxide 10 is provided with a thickened portion 13 adjacent the source zone 4 so that locally a strong lateral electric field is induced in the channel at higher gate voltages. An efficient charge transport of electrons to the floating gate 9 is obtained through this lateral electric field in the channel and the comparatively high electric field in the gate oxide. The thickened portion of the gate oxide may be obtained in a simple manner through thermal oxidation. To prevent the formation of strong fields at the drain side of the channel, the drain is preferably provided with an LDD structure 5a which adjoins the gate oxide. As a result, Fowler-Nordheim tunnelling through this thin gate oxide may also be used for erasing.

11 Claims, 2 Drawing Sheets

SEMICONDUCTOR DEVICE HAVING A NONVOLATILE MEMORY CELL IN WHICH THE FLOATING GATE IS CHARGED WITH HOT CHARGE CARRIERS AT THE SOURCE SIDE

This is a continuation of application Ser. No. 08/548,931, filed Oct. 26, 1995, now abandoned.

BACKGROUND OF THE INVENTION

The invention relates to a semiconductor device with a semiconductor body which is provided at a surface with a memory element comprising a field effect transistor with a source zone and a drain zone and a channel region situated between the source and drain zones, and provided with a control electrode and a floating gate electrode situated between the control electrode and the channel region and separated from the surface by an interposed gate dielectric, while means are present for providing charge on the floating gate electrode at or adjacent the source zone through generation of hot charge carriers. The invention also relates to a non-volatile memory provided with a number of such memory elements arranged in a system of rows and columns. Such memories are generally known, for example, under the acronyms (E)EPROM or Flash EPROM. Such a device is known inter alia from the article "A source-side injection erasable programmable read-only memory (SI-EPROM) device" by Wu et al., published in IEEE ELECTRON DEVICE LETTERS, Vol. EDL-7, No. 9, Sep. 1986, pp. 540–542.

In a conventional memory of this type, the floating gate electrode is electrically charged with hot electrons which are generated by means of high electric fields at the drain side of the channel and which are injected into the floating gate through the gate oxide. The Fowler-Nordheim tunnelling process is often used near the source zone for erasing.

One of the main parameters of an EPROM element is the speed with which the element can be programmed. Conditions for an efficient charge transport to the floating gate are: an efficient generation of hot electrons in the semiconductor body; the generation of hot electrons at or very close to the boundary between semiconductor body and gate dielectric; the electric field in the gate dielectric must promote charge transport to the floating gate. In a conventional element, hot electrons can be efficiently formed through the channel current in the transistor, given a sufficiently high voltage at the drain zone. It is much more difficult, however, to comply with two other conditions simultaneously therewith. Thus, for example, a suitable electric field may be obtained in that a comparatively high voltage is applied to the control electrode, which is usually applied above the floating gate electrode. Such a high voltage, however, leads to a reduction in the electric field in the channel near the drain zone, and thus adversely affects the generation of hot electrons.

In the cited article by Wu et al., a non-volatile memory element is described in which the generation and injection of hot electrons take place near the source zone of the transistor instead of in the drain zone in order to counteract the above disadvantages. The electric field necessary for accelerating the electrons is obtained in that the source zone, as seen at the surface, is provided at some distance from the stack formed by the floating gate and the control electrode. A poly spacer is used in the manufacture, lying between the source zone and the stack of gate electrodes so as to form an additional floating gate electrode. An extra poly layer is necessary for the manufacture of this cell as compared with a conventional cell. In addition, the spacer obtained simultaneously at the drain side of the stack must be removed in a separate etching step with the use of an additional mask.

SUMMARY OF THE INVENTION

The invention has for its object inter alia to provide a less intricate, non-volatile memory cell in which the charge transport of hot charge carriers takes place at the source side of the channel and which can be manufactured in a comparatively simple manner.

According to the invention, a semiconductor device of the kind mentioned in the opening paragraph is characterized in that said means comprise a thickened portion of the gate dielectric adjoining the source zone, while the pn junction of the source zone intersects the surface of the semiconductor body below the thickened portion, the source zone and the floating gate electrode, seen at the surface, have edges which coincide at least substantially, and the gate dielectric at the area where the pn junction of the drain zone intersects the surface is thinner than the gate dielectric at the area of the thickened portion. The thickened portion of the gate dielectric may be obtained, for example, through thermal oxidation. A gate oxide then arises which becomes gradually thicker in the direction of the channel towards the source zone between the floating gate and the channel and which has a so-called bird's beak profile. This profile causes in the subjacent portion of the channel an electric field component in lateral direction of sufficient value and width for supplying electrons in the channel with the required energy for transport to the floating gate electrode. This charge transport is in addition favorably affected by the voltage present in situ between the control electrode and the channel which is smaller at the drain side than at the source side.

During oxidation, the oxide becomes thicker also at the drain side, unless a mask protecting against oxidation is used. An embodiment which has the advantage that the oxide thickening at the drain side has no or at least substantially no influence on the field distribution in the channel is characterized in that the gate dielectric and the floating gate electrode extend to above the drain zone, while the gate dielectric has a second thickened portion which is situated above the drain zone and, seen at the surface, at a distance from the channel. An embodiment in which a drain zone is obtained in a simple manner which extends to beyond the thickened oxide below the floating gate is characterized in that the drain zone is provided with an extension which extends under the second thickened portion up to the channel region.

The cell may be erased in various manners known per se. A preferred embodiment is characterized in that the gate dielectric at the drain side of the channel has a thickness such that information stored on the floating gate electrode can be erased through tunnelling of charge carriers between the floating gate electrode and the drain zone.

BREIF DESCRIPTION OF THE DRAWING

The invention will be explained in more detail with reference to an embodiment and the accompanying diagrammatic drawing, in which.

DESCRIPTION OF THE PREFERRED EMBODIMENTS

Figure 1:
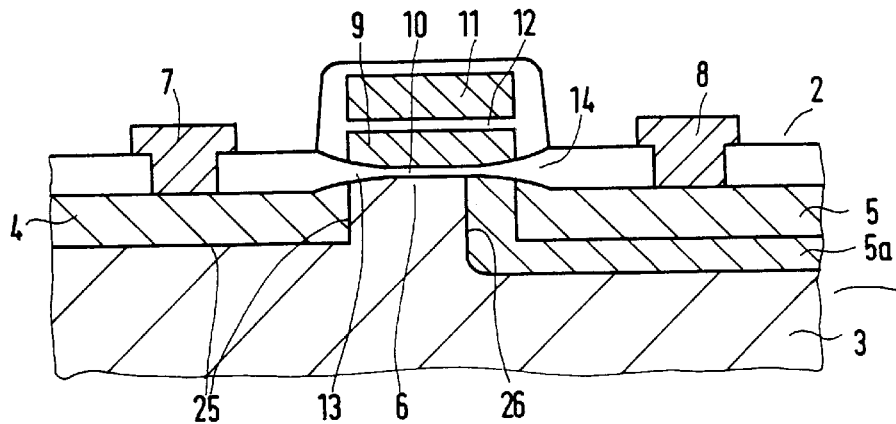
FIG. 1 is a cross-section of a semiconductor device according to the invention.

It is noted that the drawing is diagrammatic and that the various components are not depicted true to scale. The semiconductor device of FIG. 1 comprises a semiconductor body 1, for example made of silicon, with a surface region 3 of a first conductivity type, in this example the p-type, adjoining a surface 2. The surface region 3 is provided with a non-volatile memory element in the form of a field effect transistor with a source zone 4, a drain zone 5, and a channel 6 situated between the source and drain zones. The source zone and the drain zone are formed by n-type surface zones and are provided with a source electrode 7 and a drain electrode 8, respectively. Above the channel 6 there is a floating gate electrode 9 of silicon which is separated from the channel 6 by a dielectric layer 10 which is usually formed by silicon oxide. The gate electrode 9 is surrounded on all sides by electrically insulating material, so that non-volatile information in the form of electric charge can be stored on the electrode 9. Above the floating gate electrode 9 there is a usual control electrode 11 which is insulated from the floating gate electrode by an interposed dielectric layer 12.

Writing is carried out with hot electrons which are generated adjacent the source zone 4 in that an electron current is passed from the source to the drain zone. The device is for this purpose provided with means near the source zone 4 for generating a high electric field in the channel at the source side, in which field the electrons are accelerated. According to the invention, these means comprise a thickened portion 13 of the gate dielectric 10, while the pn junction 25 of the source zone 4 intersects the surface 2 of the semiconductor body 1 below the thickened portion 13. The mutually facing edges of the floating gate electrode and of the source zone 4 coincide at least substantially so that at least the gate electrode 9 extends over the portion of the channel adjoining the source zone below the thickened portion 13. The pn junction 26 of the drain zone 5 intersects the surface 2 in a location in the channel 6 where, as is evident from FIG. 1, the gate oxide 10 is thinner than at the area of the thickned portion 13, whereby it is avoided that large electric fields are formed also at the drain side of the channel. In the present example, the floating gate electrode and the control electrode are provided in the form of a stack, so that these electrodes have coinciding edges, at least in longitudinal direction of the channel, and both cover the entire channel 6 between the source zone 4 and drain zone 5.

The thickened portion 13 of the gate oxide may be obtained in various ways which are known per se. In this embodiment, where the semiconductor body and the floating gate electrode 9 are made of silicon and the gate dielectric 10 of silicon oxide, a first thickened portion 13 is formed by an oxide layer which is obtained at least partly through thermal oxidation of silicon material at the area of the source zone 4. The oxide becomes gradually thicker in the direction of the channel towards the source zone 4, which is favorable for the field distribution in the channel. At the other side of the channel, the drain side, a second thickened portion 14 in the oxide, may also be formed during this oxidation step. This thickened portion is situated above the drain zone 5 at a distance from the channel 6, and accordingly has no or at least substantially no influence on the field distribution in the channel. The asymmetry between source zone and drain zone is obtained in this embodiment in that the drain zone is provided with an extension 5a which is present under the second thickened portion 14 up to the channel 6.

Figure 2:
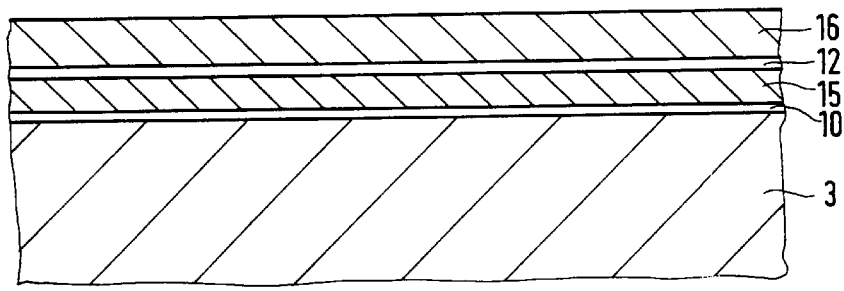
FIGS. 2–4 show several stages in the manufacture of this device.
Figure 3:
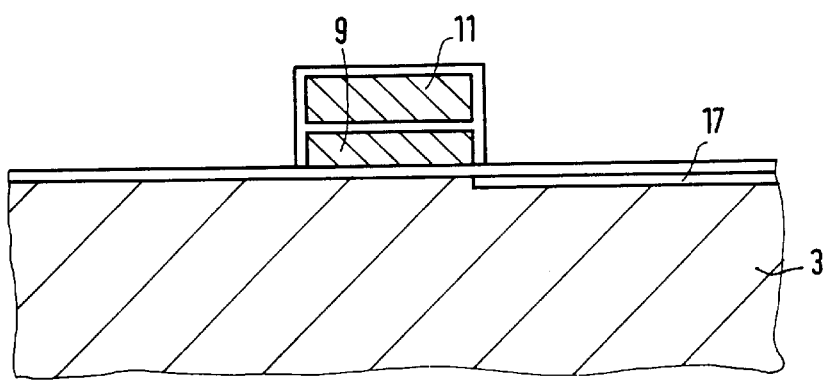
Figure 4:
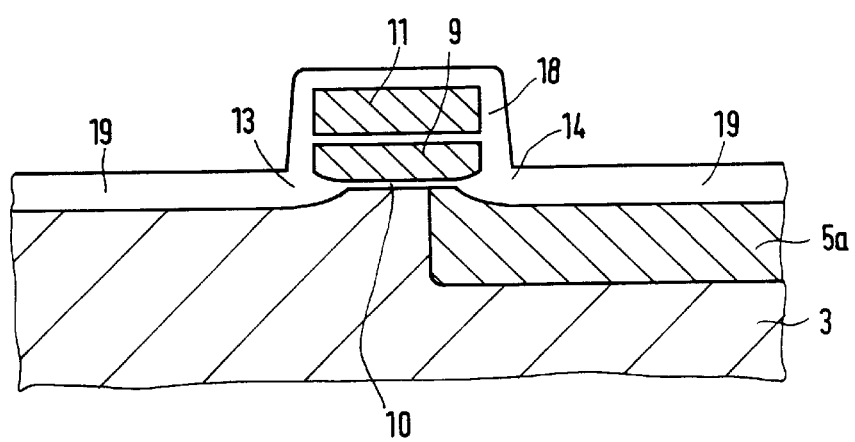

A few steps in the manufacture of the device are described with reference to FIGS. 2–4. The starting point is a silicon substrate 1 of which at least the surface region 3 is of the p-type with a doping concentration of $10^{17}$ at/cm$^3$. The oxide layer 10 with a thickness of approximately 12 nm, forming the gate dielectric of the transistors to be manufactured, is obtained on the surface through oxidation. On the oxide layer 10, a first, approximately 0.3 $\mu$m thick layer 15 of polycrystalline silicon (called poly hereinafter for short) is deposited by CVD and n-type doped during the deposition or in a separate doping step after the deposition. The floating gate electrode 9 is manufactured from the first poly layer in a later stage. First an interpoly dielectric 12 is formed on the poly layer 15. This layer in a simple embodiment may be formed by a silicon oxide layer with a thickness of, for example, 25 nm. In alternative embodiments, this layer may comprise other materials, for example, oxynitride or a system of various layers such as, for example, oxide-nitride-oxide (ONO). A second n-type doped poly layer 16, from which the control electrode 11 will be manufactured in a later stage, is formed on the layer 12 in a manner known per se. FIG. 2 shows the device after the deposition of the second poly layer 16. The control electrode 11 and the floating gate electrode 9 are formed from the poly layers 15 and 16 by known techniques (FIG. 3), after which phosphorus atoms are provided in the surface zone 17 through ion implantation in a self-aligned manner.

In a next step, shown in FIG. 4, the device is subjected to a thermal oxidation whereby a thickened portion of approximately 50 nm is formed below the edges of the floating gate electrode 9, extending from the edge of the gate 9 in the shape of a bird's beak to below the floating gate. At the same time, an oxide layer 18 is formed on the sides of the poly stack 9, 11 so as to act as a spacer or part of a spacer during the source and drain implantation. The oxide layer 19 is provided on the surface of the semiconductor body to a thickness which may be slightly smaller than the thickness of the layer 18 owing to the difference in oxidation rate between polycrystalline and monocrystalline silicon. Lateral oxygen diffusion also converts silicon material below the floating gate electrode into silicon oxide, so that the oxide 14 extends to below the floating gate electrode at the edges of the channel and is given a so-called bird's beak profile which is used for obtaining the electric field distribution in the channel. During this oxidation step or during a separate heating step, the phosphorus atoms provided in the surface zone 17 diffuse further into the silicon body and form the n-type zone 5a which extends to below the thin gate oxide 10. In a next step, a spacer of the desired width can be formed on the sides of the stack 9, 11, for which purpose first an oxide layer is deposited in known manner, from which the spacers are obtained by anisotropic etching-back. During this etching step, the oxide 19 next to the stack 9, 11 with spacer may be partly or wholly removed, which is favorable for the source and drain implantation. The device is subsequently subjected to an implantation whereby the strongly doped n-type zones 4 and 5 are formed through doping with, for example, arsenic. The spacer on the edges of the stack 9, 11 achieves that the edge of the zone 4 (FIG. 1) facing towards the channel 6 coincides substantially with the edge of the gate electrodes 9 and 11, so that part of the channel 6 is situated below the thicker oxide 13 of the bird's beak. The device may further be subjected to usual operations such as the provision of contact windows in the oxide layer 14 and the provision of the contacts 7 and 8. Such operations are generally known in the field and are accordingly not described any further here.

Figure 5:
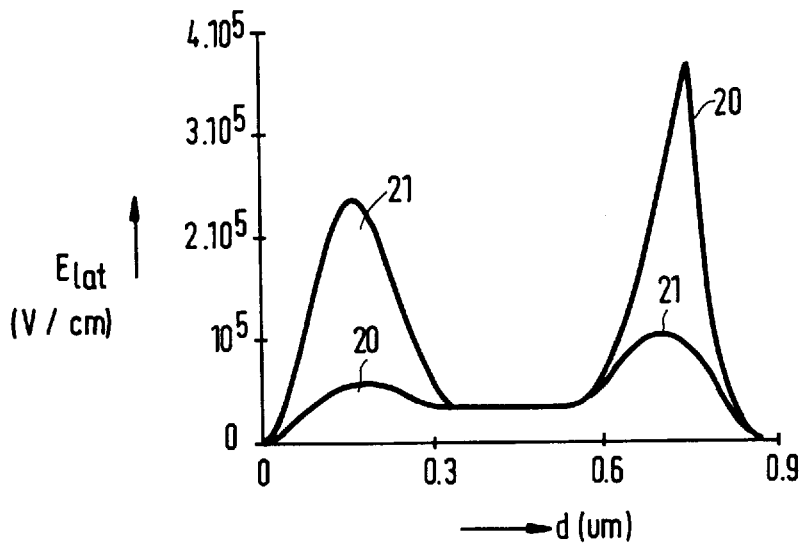
FIG. 5 shows the lateral electric field distribution in the channel for two different gate voltages.
Figure 6:
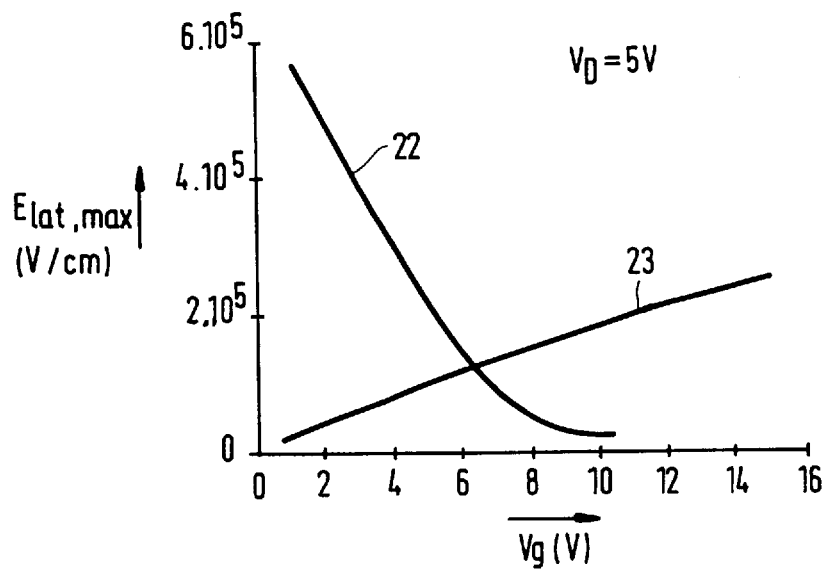
FIG. 6 is a graph indicating the maximum electric field strength at the source side and at the drain side of the channel in the device of FIG. 1.

FIG. 5 shows the field distribution in the channel for two different voltages at the control electrode. The voltage at the drain zone is 5 V in both cases. The distance d in the channel to the source zone is plotted on the horizontal axis, and the lateral electrical field strength on the vertical axis. Curve 20 shows the situation at a low gate voltage, for example, 3 V. The field strength at the drain side of the channel in this case is much greater than at the source side of the channel. Hot electrons are formed, it is true, at the drain side of the channel owing to the high electric field. The transport of these electrons to the floating gate, however, is counteracted by the electric field in the gate oxide which is very weak, or even has the wrong direction owing to the voltage at the drain zone. Curve 21 shows the field distribution in the channel for a much higher gate voltage at the same drain voltage, for example, a gate voltage of 10 V. In this case a strong electric field is obtained at the source side of the channel and a comparatively weak field at the drain side. The electrons in the channel are now accelerated at the source side. An effective charge transport to the floating gate takes place now, also owing to the high voltage between the source zone and the control electrode, whereby an electric field favoring charge transport is formed in the gate oxide. FIG. 6 shows the (calculated) maximum lateral field strength at the drain side (curve 22) and at the source side (curve 23) of the channel as a function of the (floating) gate voltage for a memory cell as described herein. It is evident from the graph that the electric field strength at the drain side becomes small and that at the source side becomes great for high voltages applied to the control electrode.

The Fowler-Nordheim tunnelling effect may be used for erasing, at the said thickness of the thin gate oxide 10, in that a high positive voltage is applied to the drain zone and a low voltage to the control electrode. Under these circumstances, electrons are capable of tunnelling from the floating gate electrode through the gate oxide 10 to the drain zone 5.

The device described above may be manufactured by standard techniques from only two poly layers.

Figure 7:
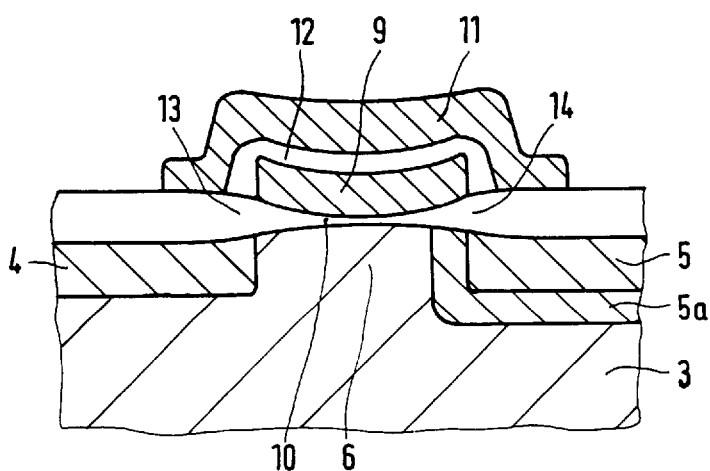
FIG. 7 is a cross-section of a second embodiment of a semiconductor device according to the invention.

FIG. 7 is a cross-section of an alternative embodiment of a semiconductor device according to the invention with two poly layers for the gate electrodes. The floating gate electrode 9 and the control electrode 11 in this example do not form a stack, as in the previous example, but are defined mutually independently in the direction of the channel length. The floating gate 9 is provided on the comparatively thin gate oxide 10. The control electrode 11 overlaps the floating gate electrode 9 and extends on either side of the floating gate electrode over the thickened portions 13 and 14 of the gate oxide. The edge of the source zone 4 again substantially coincides with the edge of the floating gate electrode 11, so that again a strong electric field can be generated below the adjoining portion 13 of the gate oxide, in which field hot charge carriers are formed for the purpose of writing. The formation of peaks in the field distribution at the drain side of the channel 6 is prevented by means of the drain extension 5a.

It will be obvious that the invention is not limited to the embodiments given here, but that many more variations are possible to those skilled in the art within the scope of the invention. Thus the conductivity types in the embodiments described may be reversed. The thickening of the gate dielectric may be obtained in a manner other than by means of an oxidation step, for example, by means of deposition and photolithography. Mechanisms other than the tunnelling effect may be used for erasing, for example, injection of holes into the floating gate electrode. These holes may be formed through avalanche breakdown of the pn junction of the drain zone and compensate for the electron charge on the floating gate.

We claim:

1. A semiconductor device with a semiconductor body having a surface, a memory element at said surface comprising a field effect transistor with a source zone and a drain zone, each separated from a surrounding portion of the semiconductor body by a pn-junction, a channel region situated between the source and drain zones, a control electrodes, a floating gate electrode situated between the control electrode and the channel region, a gate dielectric separating the floating gate electrode from the surface, and means for providing charge, on the floating gate electrode at or adjacent the source zone through generation of hot charge carriers, characterized in that: said means comprise a thickened portion of the gate dielectric adjoining the source zone, while the pn-junction of the source zone intersects the surface of the semiconductor body below the thickened portion, the source zone and the floating gate electrode have edges extending toward the surface which coincide at least substantially, and the gate dielectric at the area where the pn-junction of the drain zone intersects the surface is thinner than the gate dielectric at the area of the thickened portion.

2. A semiconductor device as claimed in claim 1, characterized in that the semiconductor body is made of silicon, the dielectric layer of silicon oxide, and the floating gate electrode of silicon, while the thickened portion of the gate dielectric is formed by an oxide layer which is obtained at least partly through thermal oxidation of silicon material at the area of the source zone.

3. A semiconductor device as claimed in claim 2, characterized in that the gate dielectric and the floating gate electrode extend to above the drain zone, while the gate dielectric has a second thickened portion which is situated above the drain zone and, at the surface, is at a distance from the channel.

4. A semiconductor device as claimed in claim 3, characterized in that the drain zone includes with an extension which extends under the second thickened portion up to the channel region.

5. A semiconductor device as claimed in claims 1, characterized in that the gate dielectric at the drain side of the channel has a thickness such that information stored on the floating gate electrode can be erased through tunnelling of charge carriers between the floating gate electrode and the drain zone.

6. A non-volatile memory device comprising a number of memory elements, each memory element comprising a field effect transistor with a source zone and a drain zone, each separated from a surrounding portion of the semiconductor body by a pn-junction, and with a channel region situated between the source and drain zones, a control electrode and a floating gate electrode situated between the control electrode and the channel region, a gate dielectric separating the floating electrode from the surface and means for providing charge on the floating gate electrode at or adjacent the source zone through generation of hot charge carriers, characterized in that: said means comprise a thickened portion of the gate dielectric adjoining the source zone, while the pn-junction of the source zone intersects the surface of the semiconductor body below the thickened portion, the source zone and the floating gate electrode, seen at the surface, have edges which coincide at least substantially, and the gate dielectric at the area where the pn-junction of the drain zone intersects the surface is thinner than the gate dielectric at the area of the thickened portion, said memory elements being arranged in a system of rows and columns in a common semiconductor body.

7. A semiconductor device as claimed in claim 1, characterized in that the gate dielectric and the floating gate electrode extend to above the drain zone, while the gate dielectric has a second thickened portion which is situated above the drain zone and, seen at the surface, is at a distance from the channel.

8. A semiconductor device with a memory element, comprising:
   (a) a semiconductor body having a surface; and
   (b) a field effect transistor comprising the memory element, said field effect transistor including
      (i) a source zone and a drain zone, each forming a pn-junction with a surrounding portion of the semiconductor body,
      (ii) a channel region of the semiconductor body between the source zone and the drain zone,
      (iii) a control electrode, and a floating gate electrode situated between the control electrode and the channel region, said floating gate electrode having a first lateral edge adjacent said source zone and a second lateral edge adjacent said drain zone, and
      (iv) a gate dielectric extending at said surface of said semiconductor body and separating said floating gate electrode from said semiconductor body, said gate dielectric including a narrow portion and first and second thickened portions, said thickened portions being thicker than said narrow portion and merging into said narrow portion, said narrow portion being located between said lateral edges of said floating gate electrode, each thickened portion extending outwardly from said narrowed portion past a respective said lateral edge of said floating gate electrode and contiguous with a respective one of said source zone and said drain zone,
   said pn-junction of the source zone terminating at said surface at a lateral location at least substantially coinciding with said first lateral edge of said floating gate electrode, and
   said pn-junction of said drain zone terminating at said surface at a lateral location between said first and second lateral edges of said floating gate electrode where said gate dielectric is narrower than said gate dielectric location where said pn-junction of said source zone terminates at said surface;
   said field effect transistor having an electric field strength at said source zone which, as the voltage applied to said control electrode increases, increases at said source zone and decreases at said drain zone and
   accelerates hot charge carriers generated in said channel from said source zone to said floating gate electrode.

9. A semiconductor device as claimed in claim 8, characterized in that the semiconductor body is made of silicon, the dielectric layer of silicon oxide, and the floating gate electrode of silicon, while the thickened portion of the gate dielectric is formed by an oxide layer which is obtained at least partly through thermal oxidation of silicon material at the area of the source zone.

10. A semiconductor device with a memory element, comprising:
    (a) a semiconductor body having a surface; and
    (b) a field effect transistor comprising the memory element, said field effect transistor including
       (i) a source zone and a drain zone, each forming a pn-junction with a surrounding portion of the semiconductor body,
       (ii) a channel region of the semiconductor body between the source zone and the drain zone,
       (iii) a control electrode, and a floating gate electrode situated between the control electrode and the channel region, said floating gate electrode having a first lateral edge adjacent said source zone and a second lateral edge adjacent said drain zone, and
       (iv) a gate dielectric extending at said surface of said semiconductor body and separating said gate electrode from said semiconductor body, said gate dielectric including a narrow portion and a thickened portion, said thickened portion being thicker than said narrow portion and including a portion of continuously reducing thickness merging into said narrow portion, said narrow portion being located between said lateral edges of said floating gate electrode, and said thickened portion extending outwardly from said narrowed portion past said first lateral edge of said gate electrode and contiguous with said source zone,
    said pn-junction of the source zone terminating at said surface at a lateral location at least substantially coinciding with said floating first lateral edge of said floating gate electrode, and
    said pn-junction of said drain zone terminating at said surface at a lateral location between said first and second lateral edges of said gate electrode at a location where said gate dielectric is narrower than at said gate dielectric location where said pn-junction of said source zone terminates at said surface, and
    said field effect transistor having an electric field strength at said source zone which, as the voltage applied to said control electrode increases, increases at said source zone and decreases at said drain zone, accelerating
    hot charge carriers generated in said channel between said source zone and said drain zone to said floating gate electrode from said source zone.

11. A semiconductor device as claimed in claim 10, characterized in that the semiconductor body is made of silicon, the dielectric layer of silicon oxide, and the floating gate electrode of silicon, while the thickened portion of the gate dielectric is formed by an oxide layer which is obtained at least partly through thermal oxidation of silicon material at the area of the source zone.

* * * * *